June 30, 1970 O. JANTSCH 3,518,505

POWER TRANSISTOR WITH PARTICULAR WIDTH OF BASE REGION

Filed Nov. 3, 1967 2 Sheets-Sheet 1

United States Patent Office 3,518,505
Patented June 30, 1970

3,518,505

POWER TRANSISTOR WITH PARTICULAR WIDTH OF BASE REGION

Ottomar Jantsch, Erlangen, Germany, assignor to Siemens Aktiengesellschaft, a corporation of Germany Filed Nov. 3, 1967, Ser. No. 680,563
Claims priority, application Germany, Nov. 10, 1966, S 106,916
Int. Cl. H01l 1/14
U.S. Cl. 317—234 4 Claims

ABSTRACT OF THE DISCLOSURE

The present invention relates to a power transistor with a base region which is bordered by at least one emitter region and at least one base contact region. Both of these regions are highly doped relative to the base region. Upon these highly doped regions are metallic contact strips. During operation, the density of the load carriers, injected from the highly doped emitter regions into the base region, is high in comparison to the doping density in the base region. Thus the width of the emitter region with respect to the emitter current, the thickness of the base region and the ambipolar diffusion length L of the load carriers in the base region, is optimized and is between 1.6 and 3.2 ($d_E/2L$). In accordance with the present invention, the width of the highly doped base contact regions is from ⅓ to 1/12 of the width of the highly doped emitter region.

In the production of power transistors, efforts have been made to ascertain the optimum width of a high-doped emitter region, positioned upon a low-doped base region. See for example Proc. IRE 46 (1958) 1220. Generally, the base region is the parent body of a power transistor. It is weakly doped compared to the remaining region of the transistor. It may be n- or p-conducting or even self conducting. Highly-doped emitter regions and base contact regions may be produced upon one surface of a disc-shaped base region. The emitter and base contact regions may sequentially follow each other upon the surface, as rings or strips separated from each other by ditches. The metallic emitter contacts and base contacts are attached respectively upon each of these highly-doped emitter regions or base contact regions. Said emitter regions and base contact regions may engage each other in a comb-type fashion whereby the "teeth" of said "combs" are held together by bridges. Thus, one comb constitutes the emitter and the other "comb" the base. On the opposite surface of the base region, a collector region may be located covered by metallic collector contact. As a rule, the metallic contacts of the transistor cover the largest part of the highly-doped regions, belonging thereto. If the emitter regions, or the base contact regions, are comprised of strips, then the "width" of these highly-doped regions is the width of the strips. The "thickness" $w$ of the (low-doped) base region is defined as the distance from the highly-doped regions (emitter region and base contact region) on one side of the base region to the ((highly-doped) collector region on the other side.

The relationship between emitter current $I_E$ and the width $d_E$ of the emitter region is expressed through a hyperbolic function which in an npn-power transistor is as follows:

$$I_E = f\left(\frac{d_E}{2L}\right) = I_o \text{ ctnh } \frac{d_E}{2L}\sqrt{\frac{\mu_n}{\mu_n + \mu_p}}$$

For $d_E \ll 2L$, $f$ rises relatively steep at an increase in $d_E/2L$. For $d_E \gg 2L$, $f$ asymptotically approaches 1. Thereby, L is the ambipolar diffusion length of the load carriers (injected from the highly-doped emitter region into the weakly-doped base region) and $\mu_p$ and $\mu_n$ are the mobilities (for example in cm.$^2$/Vsec.) of holes (p) or electrons (n). In a comb-type emitter, for example, the optimum emitter width may be between 1.6L and 3.2L.

No one, however, was concerned with the optimum width of the base contact region with respect to the optimum width of the emitter region. Frequently, however, the base contact regions were made just as narrow as the emitter regions. These regions, as well as the contacts belonging thereto, could hardly be made narrower than the width required by the optimum values for the emitter region. This was caused by the fact that the highly doped regions, and the contacts belonging thereto, were usually produced for power transistors, by an alloying process. Only with the advent of planar, mesa and photoresist methods, for the production of power transistors can highly-doped regions and apertaining contacts be made of much lower width than in the alloying method.

Thus, it is an object of the present invention to produce a power transistor with base contact regions having an optimum width with respect to the optimized emitter regions. This has the result that during strong injections from the emitter into low-doped base region, the current amplification factor is increased compared to known power transistors. Furthermore, for equal performance, the transistor can have smaller dimensions.

The present invention relates to a power transistor with a base region which is bordered by at least one emitter region, and at least one base contact region. Both of these regions are highly doped relative to the base region. Upon these highly-doped regions are metallic contact strips. During operation, the density of the load carriers, injected from the highly-doped emitter regions into the base region, is high in comparison to the doping density in the base region. Thus, the width of the emitter region, with respect to the emitter current, the thickness of the base region and the ambipolar diffusion length L of the load carriers in the base region is optimized and is between 1.6 and 3.2 ($d_E/2L$). In accordance with the present invention, the width of the highly-doped base contact region is from ⅓ to 1/12 of the width of the highly-doped emitter region.

The width of the base contact region has an optimum with respect to the width of the emitter region, the thickness $w$ of the base region and the diffusion length L. Furthermore, the width of the emitter contact is optimized in consideration of the emitter current, the thickness of the base region $w$ and the diffusion length L. The optimization applies preferably to a power transistor with high injection from the highly-doped emitter region into the weakly-doped base region.

According to a further development of the present invention, the base contact region of the power transistor may be so dimensioned that the median density of the current flowing through the highly-doped base contact region is approximately equal to the median current density flowing through the highly-doped emitter region. The width $d_B$ of the base contact region and the width $d_E$ of the emitter region may be interrelated relative to their order of magnitude, according to the equation:

$$d_B=d_E\left(1-\frac{1}{\cosh w/l}\right)$$

In this equation, $w$ is the thickness of the base region and $l$ is the diffusion length L, which for an npn transistor is multiplied by $$[(\mu_n+\mu_p)/\mu_p]^{1/2}$$

and for the pnp transistor by $$[(\mu_n+\mu_p)/\mu_n]^{1/2}$$

In an embodiment of the present power transistor, the width of the base contact region is approximately ⅛ of the width of the emitter region. The current amplification factor $\alpha$ increases at high injection by almost the factor 2 as compared to power transistors whose base contact region and emitter region are of approximately the same width, as was customary prior to the present invention. Thus, for equal performance, the transistor of the present invention may be smaller than known power transistors.

The invention will be further described with reference to embodiment examples illustrated by the drawing in which:

FIGS. 2 and 3 are plan views of examples of two transistors for which FIG. 1 is the cross-section;

Figure 1:
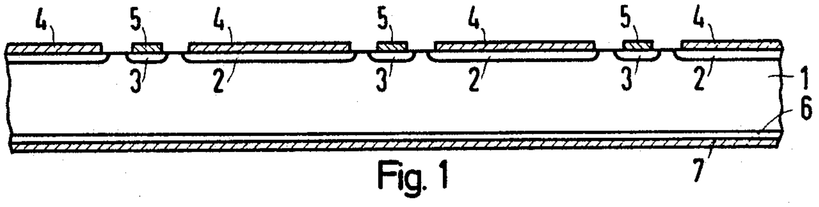
FIG. 1 is a cross-section of a power transistor of the present invention.
Figure 2:
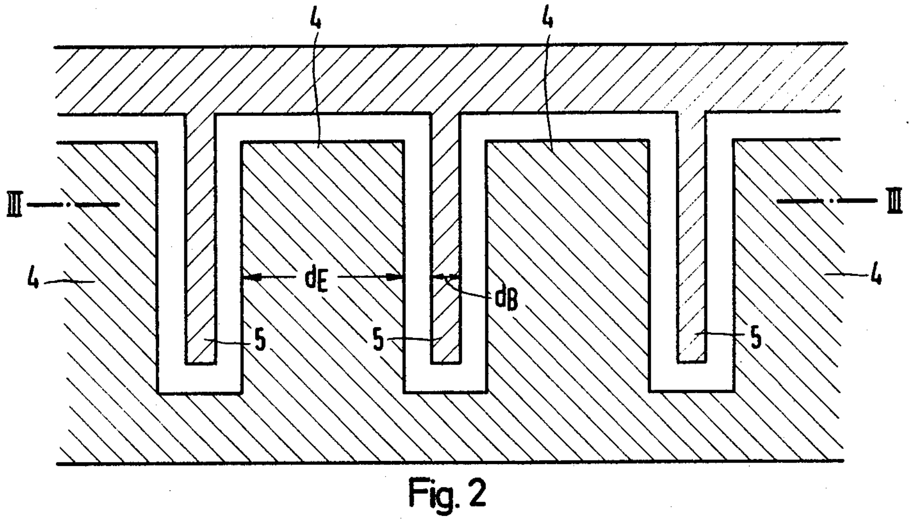
Figure 3:
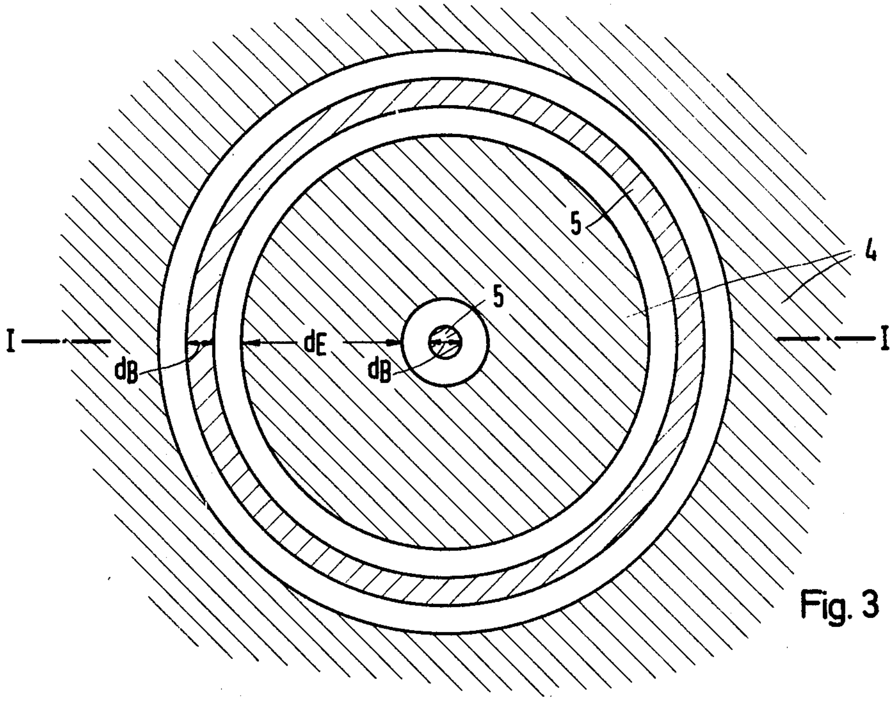

In FIG. 1, the highly-doped emitter regions 2, the highly-doped base contact regions 3 are located upon the weakly-doped base region 1. The emitter contacts 4 and base contacts 5 are situated, respectively, upon emitter regions 2 and base contact regions 3. These regions may have a variety of shapes. FIG. 2 schematically illustrates a comb-type embodiment, while FIG. 3 schematically illustrates a circular embodiment. The highly-doped collector region 6 and the collector contact 7 therefor may cover an entire face of the base region 1. In one embodiment example, the width of the emitter region $d_E$ is approximately 2L where L=diffusion length. The width $d_B$ of the base contact regions in the comb-type transistor of FIG. 2 amounts to approximately ⅛ of the width of the emitter regions. The base region 1 may be weakly p-doped, for example with $10^{13}$ impurity atoms/cm.$^3$, whereas the emitter regions 2 as well as the collector region 6 may be strongly n-doped ($n^+$) with $10^{20}$ impurity atoms/cm.$^3$ and the base contact region strong p-doped ($p^+$) with $10^{20}$ impurity atoms/cm.$^3$. A power transistor may be produced with the aforementioned measurements, i.e. with optimum widths of the emitter regions and the base contact regions, using planar, mesa or photoresist techniques. The doping agents are conventional dopants.

Figure 4:
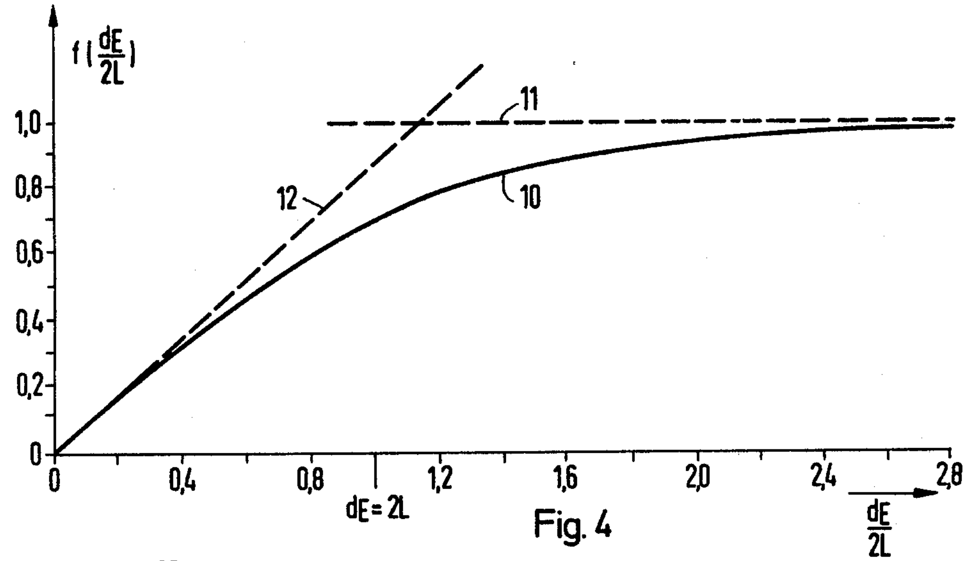
FIG. 4 is a curve showing the dependency of the emitter current to the width of the emitter region.

Curve 10 of FIG. 4 reflects the dependency of the emitter current $I_E$ upon the width $d_E$ of the high-ohmic emitter region and the diffusion length L. This relates to a hyperbolic function which was explained above. The ordinate of this hyperbolic function is $f(d_E/2L)$ and the abscissa is $d_E/2L$. The optimum of said curve is approximately between 0.8 and 1.6 ($d_E/2L$). For smaller magnitudes of $d_E$, the emitter current rises relatively high at an increased $d_E/2L$. The dotted line 12 shows the slope of curve 10 for $d_E/2L=0$. For greater magnitudes of $d_E/2L$, the emitter current asymptotically approaches a maximum 11, so that an additional increase in the width of the emitter region $d_E$ or a reduction of the diffusion length L above 1.6 ($d_E/2L$) adds virtually nothing to the current.

Figure 5:
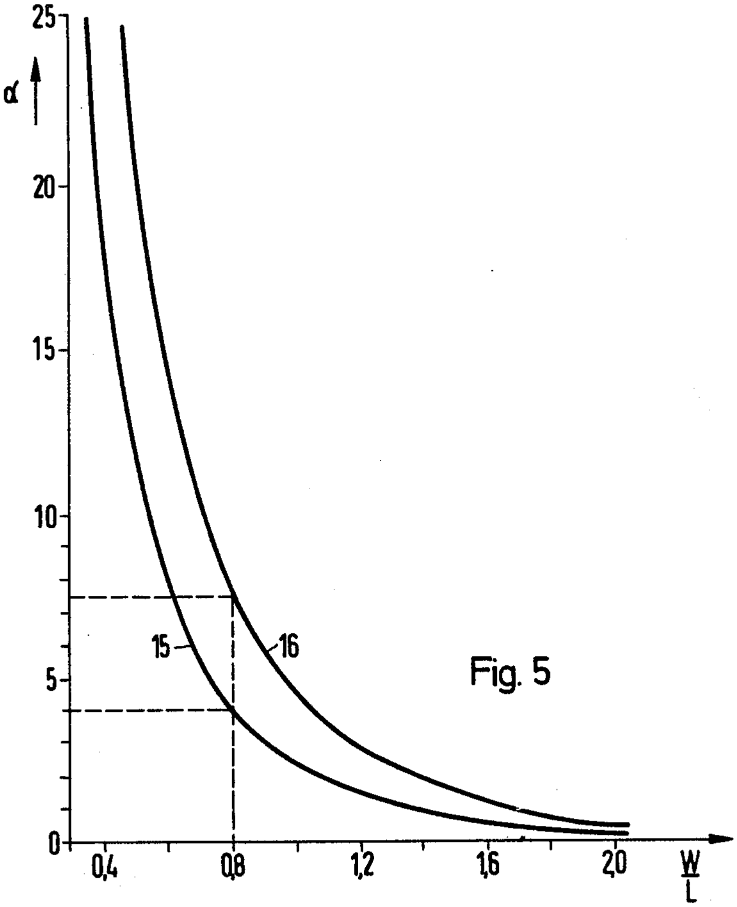
FIG. 5 is a curve showing the dependency of the width of the base contact region to the thickness and diffusion length of the base region.

FIG. 5 shows a curve illustrating the dependency of the width $d_B$ of the highly-doped base contact region upon $w/L$ (thickness $w$ and diffusion length L of the weakly-doped base region). The numerical values in the ordinate relate to the current amplification factor $\alpha$ which is the quotient of the collector and the base current. Curve 15 illustrates a power transistor where the width of the base contact region $d_B$ equals 2L. This width used to be common for base contact regions and falls within the optimum range of width $d_E$ for the emitter region. In transistors based on curve 15, $d_B=d_E=2L$. If the width $d_B$ of the base contact region is optimized in accordance with the present invention, then curve 16 supersedes curve 15 of FIG. 5. For curve 16

$$d_B=2L\left(1-\frac{1}{\cosh w/2L}\right)$$

For a specific value of $w/L$, for example 0.8, in place of the former current amplification, $\alpha=4$, we find, in FIG. 5 of the present invention, the current amplification $\alpha=7.5$. Hence, the power transistor may be greatly improved by selecting the width for the highly-doped base contact region, in accordance with the present invention.

I claim:

1. Power transistor having a base region in which at least one emitter region and at least one base contact region are diffused, both said emitter region and base contact region are highly-doped compared to the base region, metallic, strip-shaped contacts on said emitter region and said base contact region, the width of the highly-doped base contact region is from ¼ to 1/12 of the width of the highly-doped emitter region, whereby during operation, the density of the charge carriers injected from the highly-doped emitter region into the base region is great compared to the doping density in the base region.

2. The power transistor of claim 1, wherein the base contact region is so dimensioned, that the average density of the current therethrough is approximately equal to the average current density, which crosses the emitter region.

3. Power transistor with a base region, at least one emitter region and at least one base contact region bordering thereto, both said emitter region and base contact region are highly-doped compared to the base region, metallic, strip-shaped contacts on said emitter region and said base contact region, the width of the highly-doped base contact region is from ¼ to 1/12 of the width of the highly-doped emitter region, the width $d_B$ of the base contact region and the width $d_E$ of the emitter region are interrelated according to $$d_B=d_E\left(1-\frac{1}{\cosh w/1}\right)$$

where $w$ is the thickness of the base region, and $l$ is the ambipolar diffusion length L of the charge carriers injected into the base region, multiplied for an npn transistor by $$[(\mu_n+\mu_p)/\mu_p]^{1/2}$$

and for a pnp transistor by $$[(\mu_n+\mu_p)/\mu_n]^{1/2}$$

wherein $\mu_n$ and $\mu_p$ constitute the mobilities (in cm.$^2$/Vsec.) of the charge carrier.

4. The power transistor of claim 3 wherein the width of the emitter region, with respect to the emitter current, the thickness of the base region and the ambipolar diffusion length L of the load carrier in the base region is optimized and is between 1.6 and 3.2 $(d_E/2L)$.

References Cited

UNITED STATES PATENTS

| | | | |
|---|---|---|---|
| 3,160,800 | 12/1964 | Smart | 317—235 |
| 3,234,441 | 2/1966 | Fletcher | 317—234 |
| 3,356,862 | 12/1967 | Diebold et al. | 317—234 X |
| 3,381,183 | 4/1968 | Turner et al. | 317—234 |
| 3,428,874 | 2/1969 | Gerlach | 317—235 |

JOHN W. HUCKERT, Primary Examiner

R. F. POLISSACK, Assistant Examiner

U.S. Cl. X.R.

317—235